United States Patent
Xie

(10) Patent No.: US 8,324,886 B2
(45) Date of Patent: Dec. 4, 2012

(54) POWER SUPPLY TESTING SYSTEM

(75) Inventor: Ling-Yu Xie, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 451 days.

(21) Appl. No.: 12/771,107

(22) Filed: Apr. 30, 2010

(65) Prior Publication Data

US 2011/0187402 A1    Aug. 4, 2011

(30) Foreign Application Priority Data

Jan. 29, 2010    (CN) .................. 2010 2 0301862 U

(51) Int. Cl.
  *G01R 11/32*    (2006.01)
(52) U.S. Cl. ........................... 324/142; 324/100
(58) Field of Classification Search .............. 324/771
  See application file for complete search history.

(56) References Cited

U.S. PATENT DOCUMENTS 5,117,180 A * 5/1992 Swerlein ................ 324/132
6,323,652 B1 * 11/2001 Collier et al. ............ 324/508

OTHER PUBLICATIONS

Lab-Volt Ltd., Three-phase AC electrical circuits, 2010, p. 1-28.*
Larsen and Toubro, Three phase energy meter-EM301 data sheet, p. 1-2.*

* cited by examiner

*Primary Examiner* — Thomas Valone
(74) *Attorney, Agent, or Firm* — Altis Law Group, Inc.

(57) ABSTRACT

A system includes a plurality of power supply units to be tested, an electric load, a power meter, a multimeter, and a computer. Each of the plurality of power supply units has an input terminal connected to an AC power source via a switch module and an output terminal capable of outputting a plurality of power rails to an output bus via the switch module. The electric load is connected to the output bus for receiving the plurality of power rails. The power meter is configured for measuring an input power of each of the plurality of power supply units. The multimeter is configured for measuring an output power of each of the plurality of power supply units. The computer configured to calculate a conversion efficiency of each of the plurality of the power supply units.

16 Claims, 7 Drawing Sheets

POWER SUPPLY TESTING SYSTEM

This application is related to a co-pending U.S. patent application Ser. No. 12/576,855, filed on Oct. 9, 2009, entitled "power supply testing system".

BACKGROUND

1. Technical Field

The present disclosure relates to a testing system, and more particularly to a testing system for testing conversion efficiencies of a plurality of power supply units.

2. Description of Related Art

A typical testing system for testing a conversion efficiency of a power supply unit (PSU) includes a power meter, a plurality of switches, a multimeter, a microcontroller unit (MCU), a computer, and a signal conversion circuit for communicatively connecting the MCU to the computer. The power meter is capable of measuring an input power supplied to the PSU. The plurality of switches are powered on/off according to a sequence predetermined by the computer. The multimeter is configured for measuring an output power of the PSU. The computer is capable of reading data measured from the power meter and the multimeter, calculating a power conversion efficiency of the PSU, and determining whether the PSU achieves standard conversion efficiency.

However, the typical testing system just facilitates to test one PSU. If a plurality of PSUs needs to be tested, the operator has to disconnect and reconnect wires in the testing system time after time for testing the PSUs one by one, which is inefficient.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
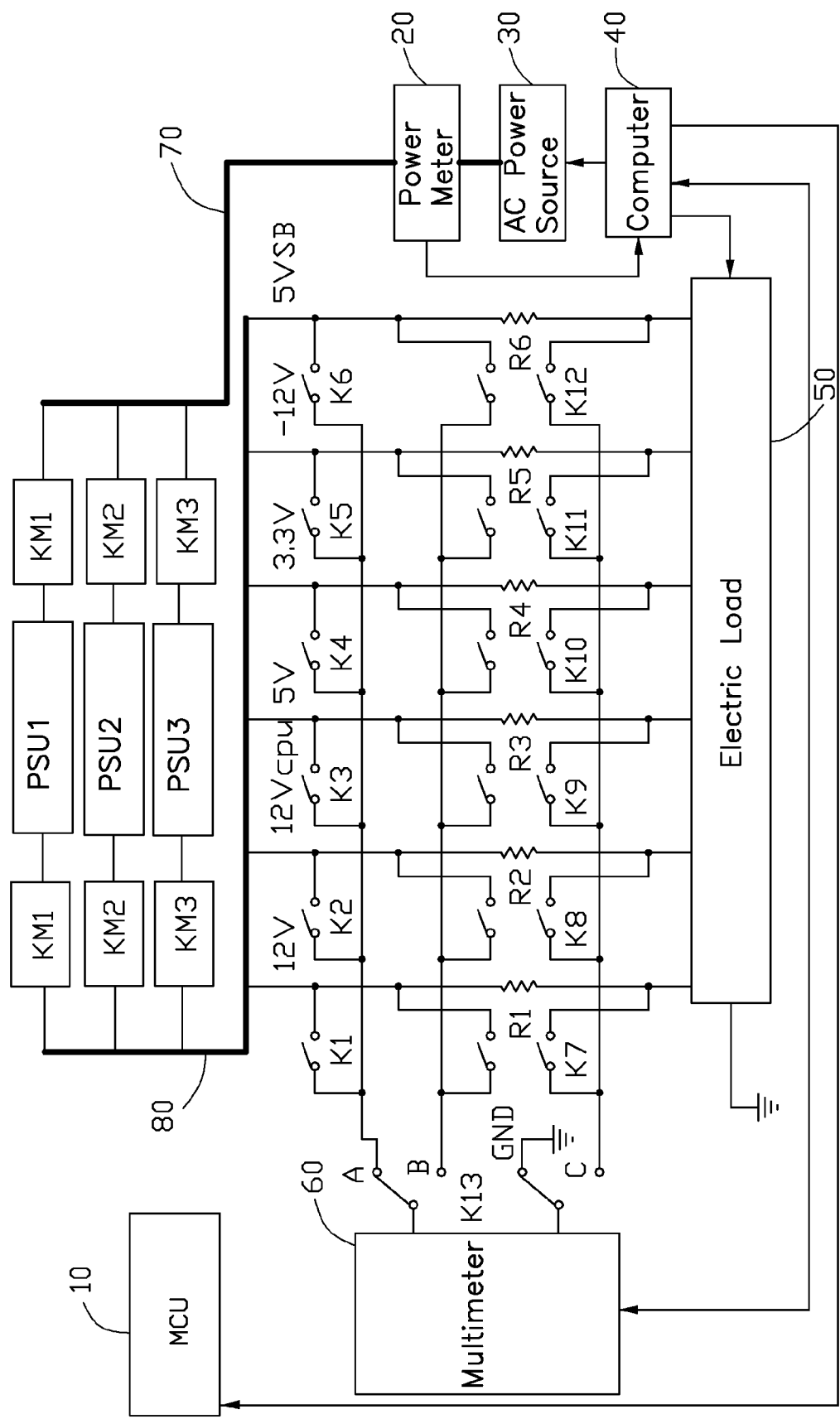
FIG. 1 illustrates an embodiment of a testing system for testing conversion efficiencies of a plurality of power supply units (PSUS).

Referring to FIG. 1, an embodiment of a testing system is configured to test conversion efficiencies of a first power supply unit (hereinafter PSU1), a second power supply unit (hereinafter PSU2), and a third power supply unit (hereinafter PSU3). The testing system includes a microcontroller unit (MCU) 10, a power meter 20, an AC power source 30, a computer 40, an electronic load 50, a multimeter 60, a plurality of switches K1-K13, and a plurality of switch modules KM1-KM3. Input terminals of the PSU1-PSU3 are connected to an input bus 70 via the switch modules KM1-KM3 respectively. Output terminals of the PSU1-PSU3 are connected to an output bus 80 via the switch modules KM1-KM3 respectively.

Each of the PSU1-PSU3 is capable of outputting power rails of 12V, 12 Vcpu, 5V, 3.3V, −12V, 5 Vaux via the output bus 80. The power rails output from the output bus 80 are supplied to the electric load 50 via the resistors R1-R6. The computer 40 is connected to the AC power source 30 for controlling an on/off state of the AC power source 30, connected to the electric load 50 for adjusting a resistance of the electric load 50, and connected to the MCU 10 for informing the MCU 10 to power on/off the switches K1-K13 and the switch modules KM1-KM3. The computer 40 is further connected to the power meter 20 and the multimeter 60 for receiving data from the power meter 20 and the multimeter 60. Then the computer 40 can use the data to calculate a power conversion efficiency of each of the PSU1-PSU3.

Figure 2:
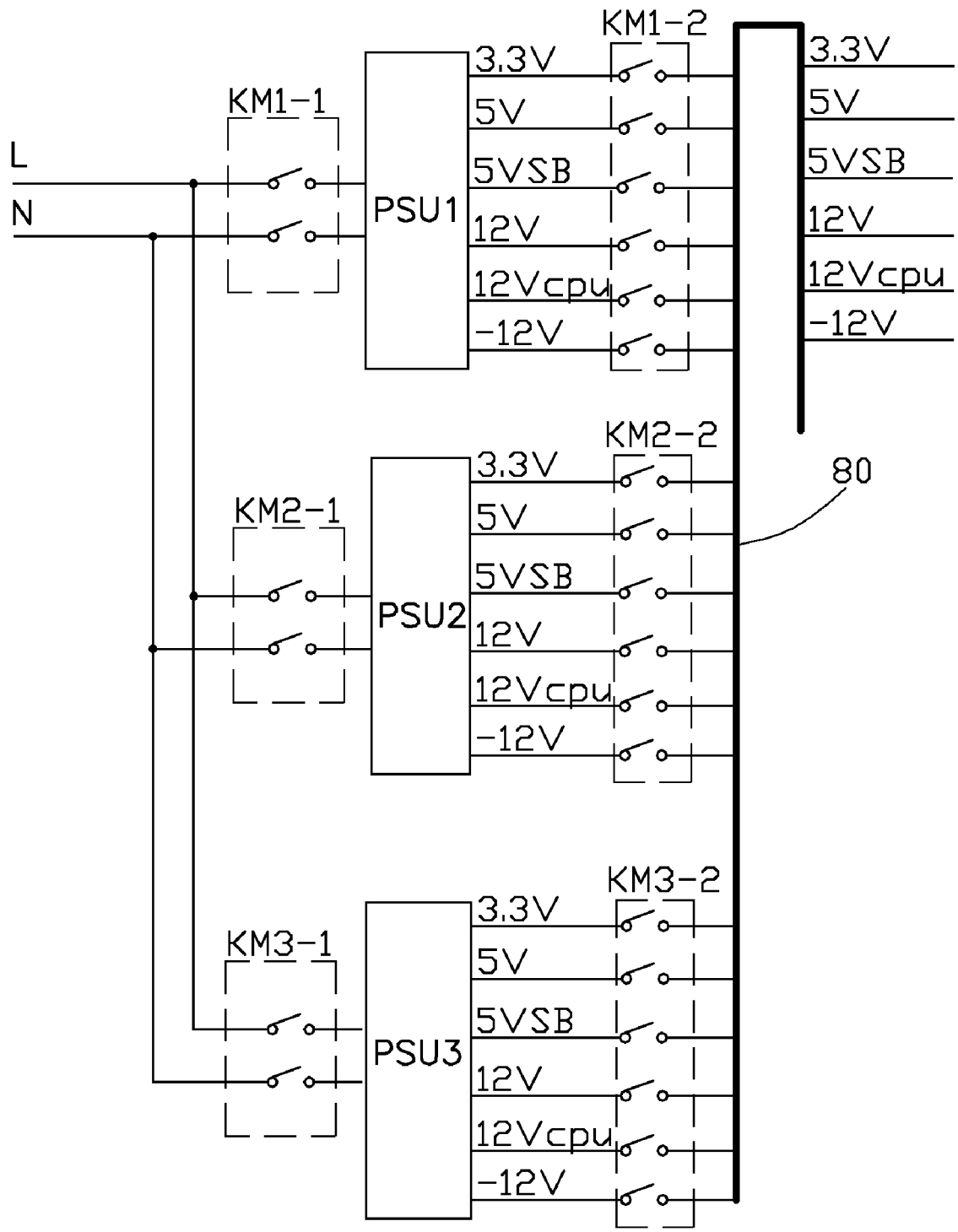
FIG. 2 illustrates detailed connections of switching modules of FIG. 1.
Figure 3:
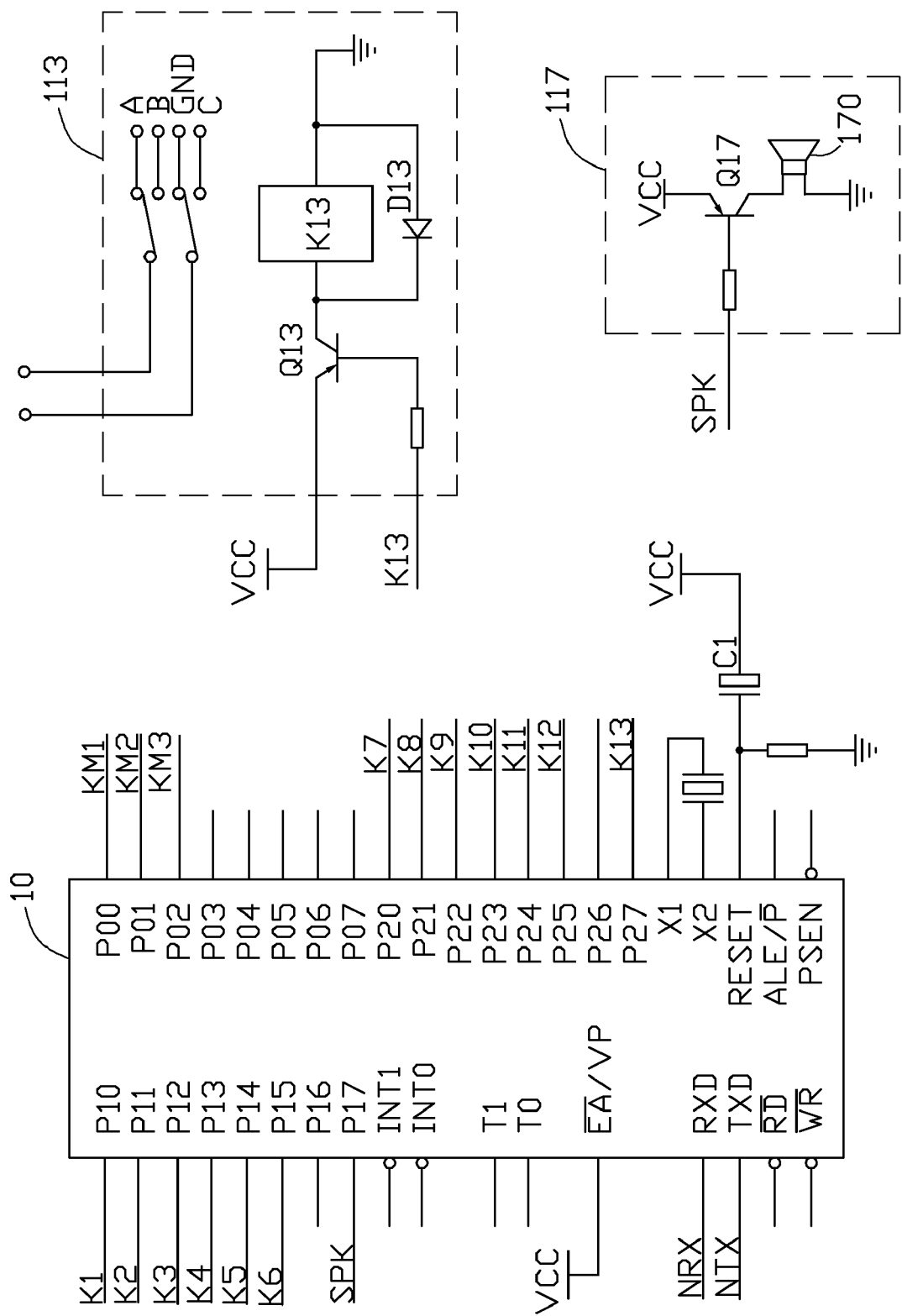
FIGS. 3-7 depict a microcontroller unit (MCU) and peripheral circuits coupled to the MCU of the testing system of FIG. 1.
Figure 4:
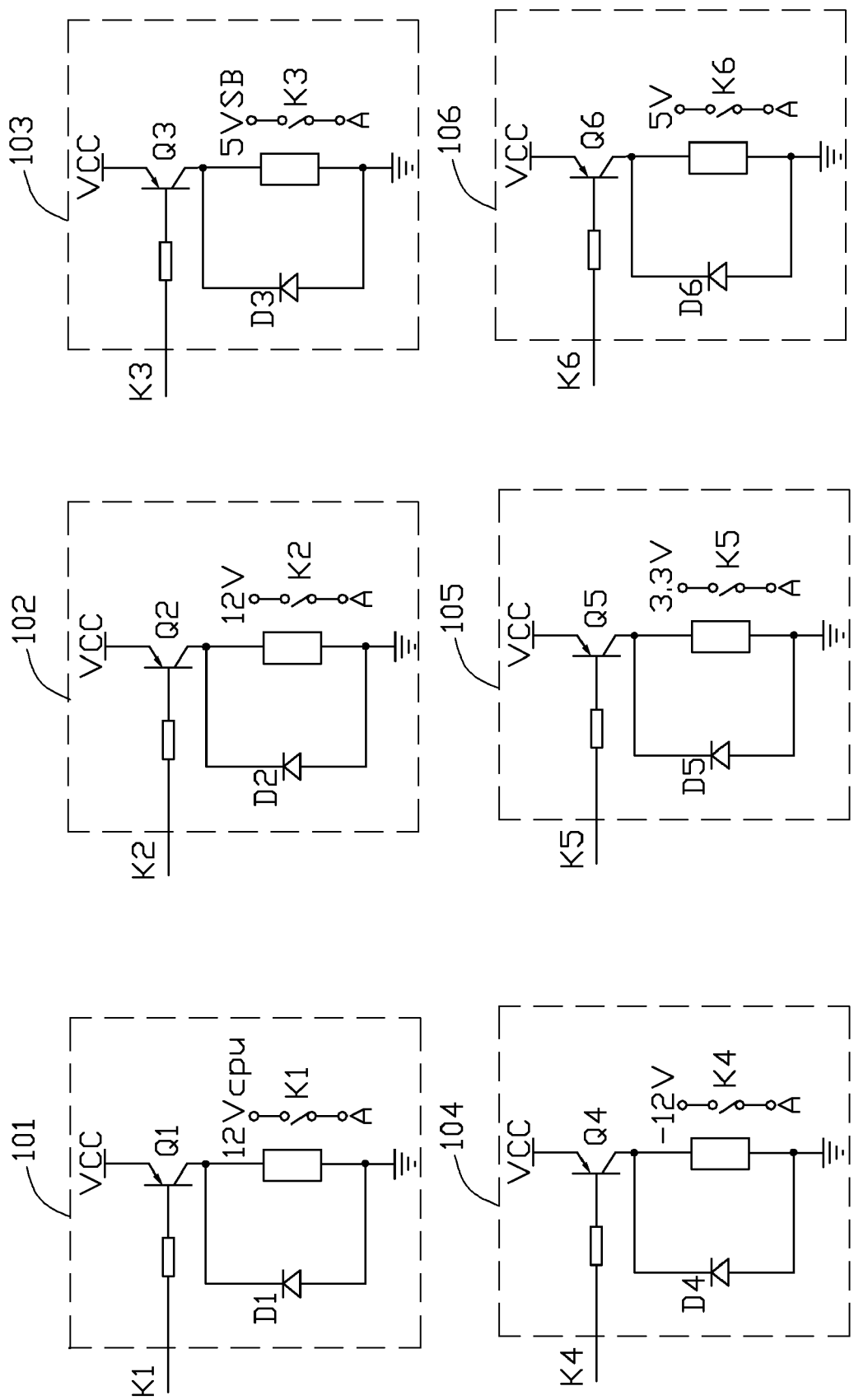
Figure 5:
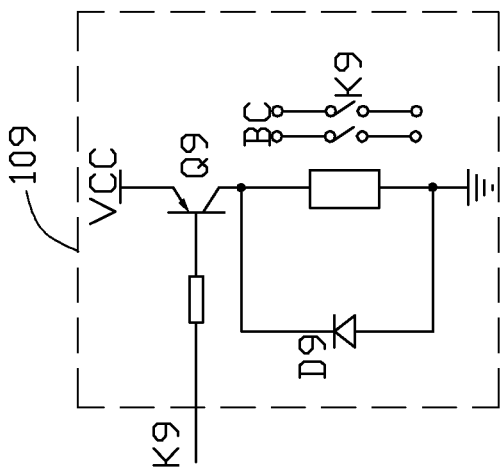
Figure 5:
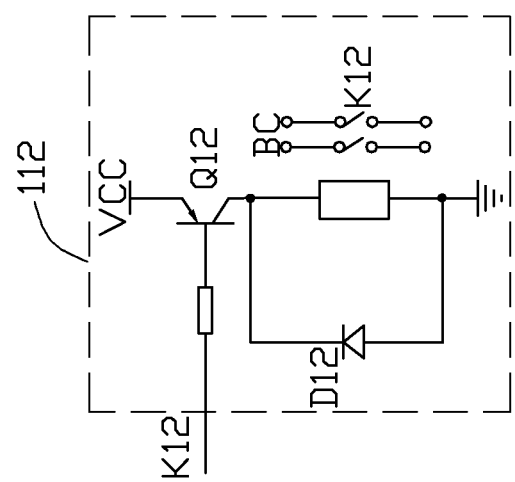
Figure 5:
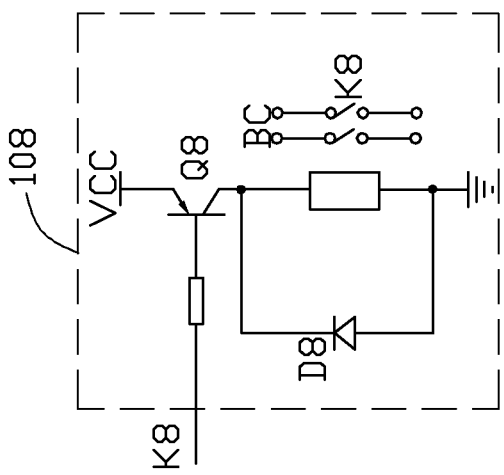
Figure 5:
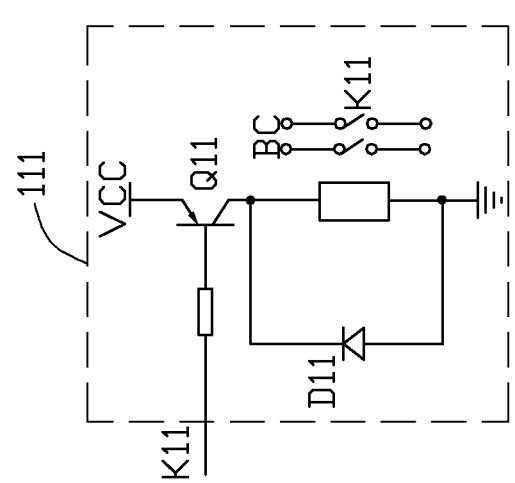
Figure 5:
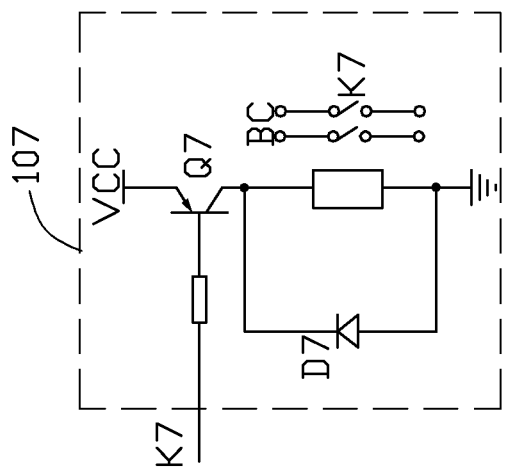
Figure 5:
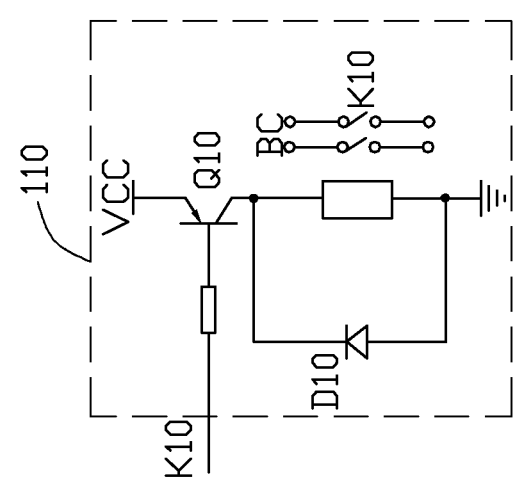
Figure 6:
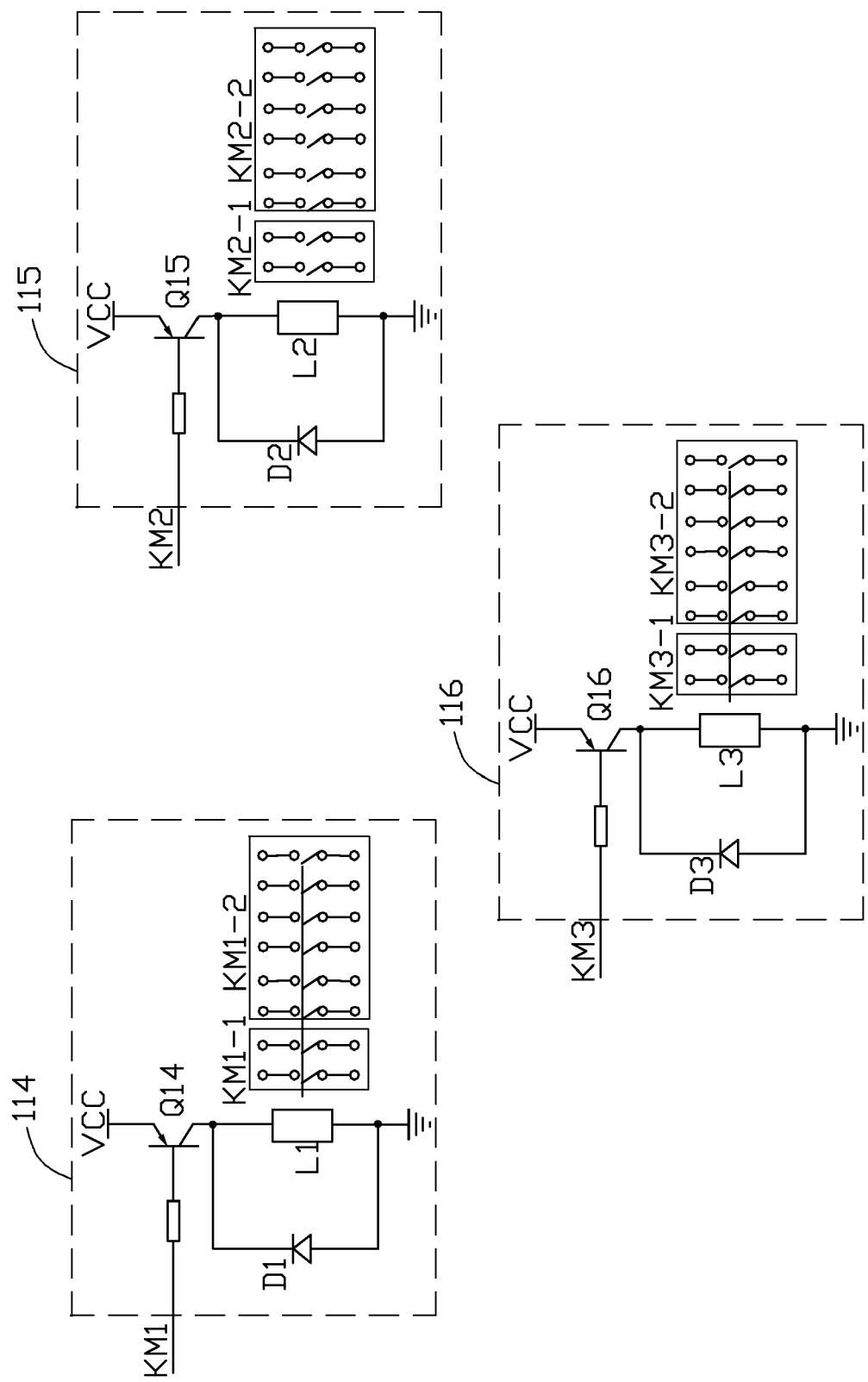
Figure 7:
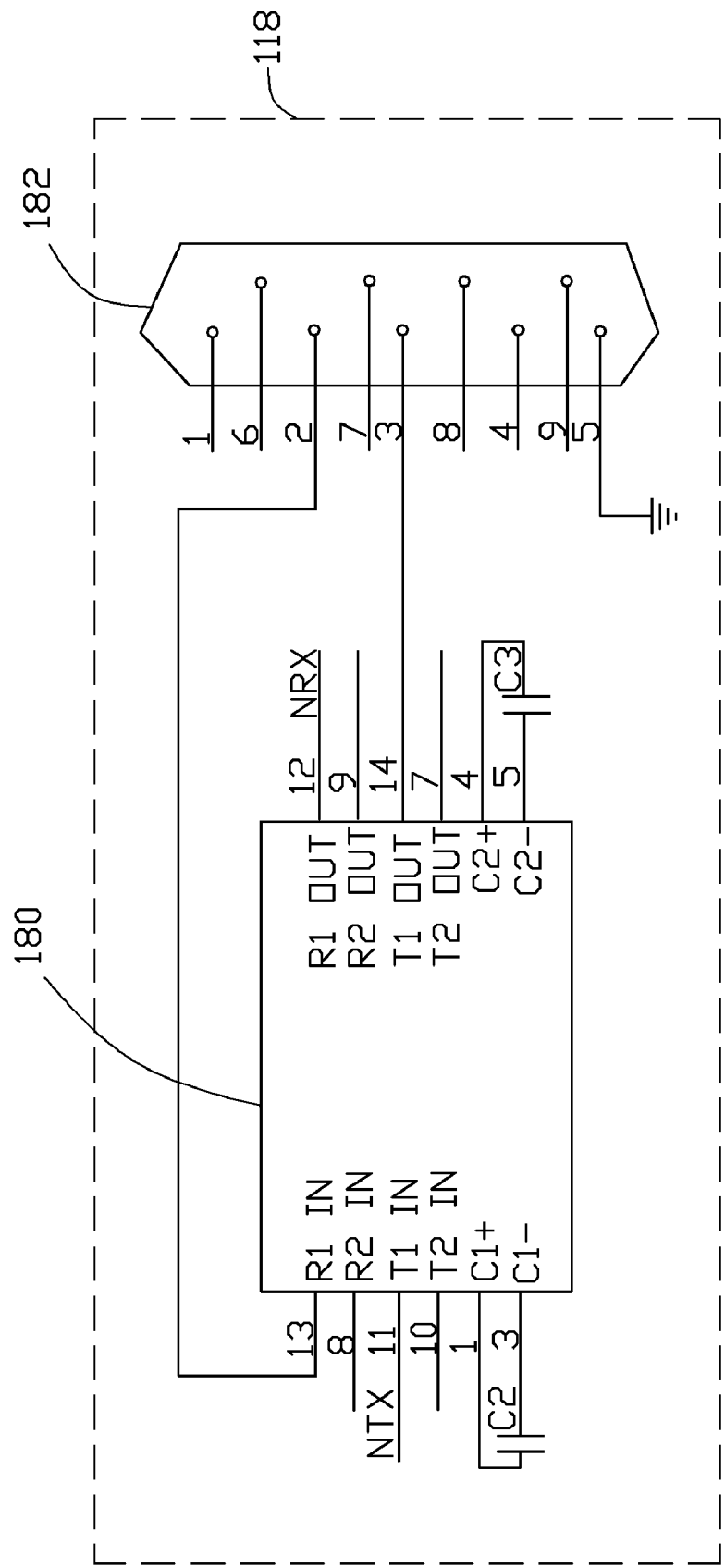

Referring to FIG. 2, the switch module KM1 includes two input control switches KM1-1 respectively connected to a live wire (L) and a naught wire (N) of the AC power source 30 and six output control switches KM1-2 connected between six output power rails of the PSU1 and the output bus 80. The switch module KM2 includes two input control switches KM2-1 respectively connected to the live wire (L) and the naught wire (N) of the AC power source 30 and six output control switches KM2-2 connected between six output power rails of the PSU2 and the output bus 80. The switch module KM3 includes two input control switches KM3-1 respectively connected to the live wire (L) and the naught wire (N) of the AC power source 30 and six output control switches KM3-2 connected between six output power rails of the PSU3 and the output bus 80.

The switch modules KM1-KM3 are multi pole-single throw relay switch modules controlled by the MCU 10. During testing the PSU1, the switch module KM1 is switched on while the switch modules KM2-KM3 are switched off. Then the input control switches KM1-1 of the switch module KM1 are closed for receiving the AC power source 30, and the output control switches KM1-2 of the KM1 are closed for outputting the power rails to the electric load 50. During testing the PSU2, the switch module KM2 is switched on while the switch modules KM1 and KM3 are switched off. During testing the PSU3, the switch module KM3 is switched on while the switch modules KM1-KM2 are switched off.

The switches K1-K13 are also relay switches controlled by the MCU 10. The switch K13 is a double pole-double throw switch. When the switch K13 is turned to a contact point A and ground in a first closed position, the multimeter 60 can measure an effective voltage of each of the power rails after each of the switches K1-K6 is closed in turn. For example, if the switch K13 is turned to the contact point A and ground (GND) and the switch K1 is closed, and the other switches are open, the multimeter 60 is connected to the 12V power rail and measures the effective voltage of the 12V power rail. If the switch K13 is turned to the contact point A and ground (GND) and the switch K2 is closed, and the other switches are open, the multimeter 60 can measure the effective voltage of the 12 Vcpu power rail.

When the switch K13 is turned to contact points B&C at a second closed position, the multimeter 60 can measure a voltage drop across each of the resistors R1-R6. For example, if the switch K13 is turned to contact points B&C and the switch K7 is turned to a closed position, keeping other switches open, the multimeter 60 and the resistor R1 are connected in parallel, and the multimeter 60 can measure the voltage drop across the resistor R1. A current flow through each of the resistors R1-R6 can be calculated using the formula: I=U/R. An output power of each of the power rails can be calculated using the formula: P=UI. Then a total output power of one of the PSU1-PSU3 under test, equal to a sum of the output powers of all the power rails (P=P1+P2+P3+ ... Pn), can be calculated.

An AC input power applied to each of the PSU1-PSU3 can be measured by the power meter 20. Thus, a ratio of the total output power to the AC input power can be calculated to determine a conversion efficiency of each of the PSU1-PSU3.

Referring also to FIGS. 3 to 7, pins P10-P15 of the MCU 10 respectively connect to a first switch circuit 101, a second switch circuit 102, a third switch circuit 103, a fourth switch circuit 104, a fifth switch circuit 105, and a sixth switch circuit 106, for controlling on/off states of the switches K1-K6. Pins P20-P25 of the MCU 10 respectively connect to a seventh switch circuit 107, an eighth switch circuit 108, a ninth switch circuit 109, a tenth switch circuit 110, an eleventh switch circuit 111, and a twelfth switch circuit 112, for controlling on/off states of the switches K7-K12. A pin P27 of the MCU 10 is connected to a thirteenth switch circuit 113, for controlling the on/off state of the switch K13. Pins P00-P02 of the MCU 10 respectively connect to a fourteenth switch circuit 114, a fifteenth switch circuit 118, and a sixteenth switch circuit 116, for controlling on/off states of the switch modules KM1-KM3.

The first switch circuit 101 includes a first PNP transistor Q1, a first diode D1, and the switch K1. A base electrode of the transistor Q1 connects to the pin P10 of the MCU 10 via a resistor. An emitting electrode of the transistor Q1 is fed by a power source VCC. A collecting electrode of the transistor Q1 is connected to a cathode of the first diode D1. An anode of the first diode D1 is connected to ground. The switch K1 is a single pole-single throw relay switch and connected with the first diode D1 in parallel. When the pin P10 of the MCU 10 sends a high level signal to the base electrode of the transistor Q1, the transistor Q1 is rendered non-conductive; a voltage level of the collecting electrode of the transistor Q1 is low; and there is nearly no current flowing through a relay coil of the switch K1, thereby keeping the switch K1 open. When the pin P10 of the MCU 10 sends a low level signal to the base electrode of the transistor Q1, the transistor Q1 is rendered conductive; a voltage level of the collecting electrode of the transistor Q1 is high; and there is an electric current (exceeding a threshold current to turn on the relay switch) flowing through the relay coil of the switches K1, thereby turning on the switch K1.

The second switch circuit 102 includes a second PNP transistor Q2, a second diode D2, and the switch K2. The switch K2 is a single pole single throw relay switch.

The third switch circuit 103 includes a third PNP transistor Q3, a third diode D3, and the switch K3. The switch K3 is a single pole single throw relay switch.

The fourth switch circuit 104 includes a fourth PNP transistor Q4, a fourth diode D4, and the switch K4. The switch K4 is a single pole single throw relay switch.

The fifth switch circuit 105 includes a fifth PNP transistor Q5, a fifth diode D5, and the switch K5. The switch K5 is a single pole single throw relay switch.

The sixth switch circuit 106 includes a sixth PNP transistor Q6, a sixth diode D6, and the switch K6. The switch K6 is a single pole single throw relay switch.

The seventh switch circuit 107 includes a seventh PNP transistor Q7, a seventh diode D7, and the switch K7. The switch K7 is a double pole single throw relay switch.

The eighth switch circuit 108 includes an eighth PNP transistor Q8, an eighth diode D8, and the switch K8. The switch K8 is a double pole single throw relay switch.

The ninth switch circuit 109 includes a ninth PNP transistor Q9, a ninth diode D9, and the switch K9. The switch K9 is a double pole single throw relay switch.

The tenth switch circuit 110 includes a tenth PNP transistor Q10, a tenth diode D10, and the switch K10. The switch K10 is a double pole single throw relay switch.

The eleventh switch circuit 111 includes an eleventh PNP transistor Q11, an eleventh diode D11, and the switch K11. The switch K11 is a double pole single throw relay switch.

The twelfth switch circuit 112 includes a twelfth PNP transistor Q12, a twelfth diode D12, and the switch K12. The switch K12 is a double pole single throw relay switch.

The thirteenth switch circuit 113 includes a thirteenth PNP transistor Q13, a thirteenth diode D13, and the switch K13. The switch K13 is a double pole double throw relay switch.

The fourteenth switch circuit 114 includes a fourteenth PNP transistor Q14, a fourteenth diode D14, and the switch module KM1. The switch module KM1 is an eighth pole single throw switch.

The fifteenth switch circuit 118 includes a fifteenth PNP transistor Q15, a fifteenth diode D15, and the switch module KM2. The switch module KM2 is an eighth pole single throw switch.

The sixteenth switch circuit 116 includes a sixteenth PNP transistor Q16, a sixteenth diode D16, and the switch module KM3. The switch module KM3 is an eighth pole single throw switch.

In one embodiment, a circuit connection and an operation principle of each of the second switch circuit 102, the third switch circuit 103, the fourth switch circuit 104, the fifth switch circuit 105, the sixth switch circuit 106, the seventh switch circuit 107, the eighth switch circuit 108, the ninth switch circuit 109, the tenth switch circuit 110, the eleventh switch circuit 111, the twelfth switch circuit 112, the thirteenth switch circuit 113, the fourteenth switch circuit 114, the fifteenth switch circuit 118, and the sixteenth switch circuit 116 are similar to that of the first switch circuit 101 described above.

An alarm circuit 117 is connected to a pin P17 of the MCU 10. The alarm circuit 117 includes a seventeenth transistor Q17 and a speaker 170 connected to the seventeenth transistor Q17. When the test ends, the speaker 170 generates audible signals.

A signal conversion circuit 118 is connected to the MCU 10. The signal conversion circuit 118 includes a data conversion chip 180, e.g., a MAX232 chip. Pin 13(R1 IN), pin 12(R1 OUT), pin 11(T1 IN), and pin 14(T1 OUT) is one data channel of the data conversion chip 180. Pin 8(R2 IN), pin 9(R2 OUT), pin 10(T2 IN), and pin 7(T2 OUT) is another data channel of the data conversion chip 180. Pin 11(T1 IN) of the data conversion chip 180 is connected to pin RXD of the MCU 10, and pin 12(R1 OUT) of the data conversion chip 180 is connected to pin TXD of the MCU 10. Pin 13(R1 IN) and pin 14(T1 OUT) are connected to a serial port connector 152 of the computer 40. The MCU 10 can send signals to the computer 40 via pin 11(T1 IN) and pin 14(T1 OUT) of the data conversion chip 180, and the computer 40 can send signals to the MCU 10 via pin 13(R1 IN) and pin 12 (R1 OUT) of the data conversion chip 180. Signals sent from the MCU 10 are TTL level signals; and the data conversion chip 180 is capable of converting the TTL level signals to serial signals, which are receivable by the serial port connector 152 of the computer 40. Signals sent from the serial port connector 152 of the computer 40 are serial signals; and the data conversion chip 180 is capable of converting the serial signals to TTL level signals which are receivable by the MCU 10.

During testing, the switch module KM1 is switched on while the switch modules KM2-KM3 are switched off, and the testing system starts to test a conversion efficiency of the PSU1. The PSU1 is powered on and outputs the power rails.

The power meter 20 measures the AC input power supplied to the PSU1 and sends the measured data to the computer 40. The computer 40 informs the MCU 10 to switch on/off the switches K1-K13 according to a predetermined sequence. The multimeter 60 measures the effective output voltage of each of the power rails of the PSU1, measures the voltage drop across each of the resistors R1-R6, and sends the measurements to the computer 40. The computer 40 stores data of the resistors R1-R7 and has processing capability to calculate the current flow of each of the power rails of the PSU1 using the formula I=U/R, the total output power of the PSU1, and the conversion efficiency of the PSU1. The computer 40 compares the conversion efficiency of the PSU1 with a standard ratio (such as 80%) and determines whether the conversion efficiency of the PSU1 meets the standard. After the PSU1 is tested, the computer 40 informs the MCU 10 to switch on the switch module KM2 and switch off the switch modules KM1 and KM3 for testing a conversion efficiency of the PSU2. After the PSU 2 is tested, the computer 40 informs the MCU 10 to switch on the switch module KM3 and switch off the switch modules KM1 and KM2 for testing a conversion efficiency of the PSU3. Then the speaker 170 of the alarm circuit 117 generates audible signals to indicate that the test ends.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

The invention claimed is:

1. A system comprising:
a plurality of power supply units, each of the plurality of power supply units having an input terminal connected to an Alternating Current (AC) power source via a switch module and an output terminal capable of outputting a plurality of power rails to an output bus via the switch module;
an electric load connected to the output bus for receiving the plurality of power rails;
a power meter connected to the input terminal of each of the plurality of power supply units for measuring an input power of each of the plurality of power supply units;
a multimeter connected to the plurality of power rails for measuring an output power of each of the plurality of power supply units; and
a computer connected to the power meter and the multimeter for receiving data measured by the power meter and the multimeter and calculating a conversion efficiency of each of the plurality of power supply units.

2. The system of claim 1, wherein the switch module comprises two input control switches respectively connected to a live wire and a naught wire of the AC power source.

3. The system of claim 2, wherein the switch module comprises a plurality of output control switches connected between the output bus and one of the plurality of power supply units.

4. The system of claim 1, wherein the switch module is a multi pole single throw relay switch.

5. The system of claim 1, further comprising a microcontroller unit (MCU) connected to the switch module for controlling an on/off state of the switch module.

6. The system of claim 5, further comprising a plurality of switches connected to the MCU.

7. The system of claim 5, further comprising a signal conversion circuit connected between the MCU and the computer, and the signal conversion circuit comprises a signal conversion chip capable of converting serial signals to TTL level signals or converting TTL level signals to serial signals.

8. The system of claim 5, further comprising an alarm circuit connected to the MCU.

9. The system of claim 5, further comprising an alarm circuit connected to the MCU.

10. The system of claim 1, wherein each of the plurality of power rails is supplied to the electric load via a resistor, and the multimeter is capable of measuring a voltage drop across the resistor.

11. The system of claim 10, further comprising a plurality of switches connected to the MCU for controlling a measurement sequence of the multimeter.

12. A system comprising:
a plurality of power supply units, each of the plurality of power supply units having an input terminal connected to an Alternating Current (AC) power source via a first switch module and an output terminal capable of outputting a plurality of power rails to output bus via a second switch module;
an electric load connected to the output bus for receiving the plurality of power rails;
a power meter connected to the input terminal of each of the plurality of power supply units for measuring an input power of each of the plurality of power supply units;
a multimeter connected to the plurality of power rails for measuring an output power of each of the plurality of power supply units;
a microcontroller unit (MCU) connected to the first switch module and the second switch module for controlling on/off states of the first switch module and the second switch module; and
a computer connected to the power meter and the multimeter for receiving data measured by the power meter and the multimeter and calculating a conversion efficiency of each of the plurality of the power supply units.

13. The system of claim 12, further comprising a signal conversion circuit connected between the MCU and the computer, and the signal conversion circuit is capable of converting signals sent from the computer to Transistor-Transistor Logic (TTL) level signals which are receivable by the MCU.

14. The system of claim 12, wherein the first switch module comprises two input control switches respectively connected to a live wire and a naught wire of the AC power source.

15. The system of claim 14, wherein the second switch module comprises a plurality of output control switches connected between the output bus and one of the power supply units.

16. The system of claim 15, wherein the first switch module and the second switch module are integrated in one module.

* * * * *